United States Patent
Lee et al.

(10) Patent No.: US 6,646,290 B1
(45) Date of Patent: Nov. 11, 2003

(54) OPTICAL STRUCTURE HAVING AN OPTICAL DIODE AND A SENSOR IN SEPARATE APERTURES INSIDE DOUBLE INSULATING LAYERS

(75) Inventors: Sang Ho Lee, Seoul (KR); Jun Young Yang, Seoul (KR); Chul Woo Park, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 10/227,054

(22) Filed: Aug. 23, 2002

(51) Int. Cl.$^7$ ................................................. H01L 27/15
(52) U.S. Cl. ............................. 257/81; 257/13; 257/21; 257/88; 257/89; 257/100; 257/104; 257/106
(58) Field of Search ........................... 257/13, 21, 104, 257/88, 99, 100, 106, 81

(56) References Cited

U.S. PATENT DOCUMENTS 6,177,672 B1 * 1/2001 Lin et al.
6,255,784 B1 * 7/2001 Weindorf

* cited by examiner

Primary Examiner—Fetsum Abraham
(74) Attorney, Agent, or Firm—Gunnison, McKay & Hodgson, L.L.P.; Serge J. Hodgson

(57) ABSTRACT

An optic semiconductor package includes a plate shaped substrate having an insulation layer through which two spaced apart layer apertures are formed. The substrate further includes a plurality of electrically conductive patterns formed on the wall surfaces of the layer apertures and a lower surface of the insulation layer. One of a laser diode and a photo detector are disposed in a different one of the two layer apertures and are each electrically connected to the electrically conductive patterns through conductive bumps formed on the laser diode and the photo detector. An insulation plate, having a plurality of plate apertures formed through portions of the insulation plate adjacent to the electrically conductive patterns, is coupled to the lower surface of the substrate. One of a plurality of conductive pins electrically connected with the electrically conductive patterns is fitted in each of the plate apertures of the insulation plate and extends downward from the insulation plate. An integral metal cap is attached to upper and side portions of the substrate to protect the substrate, the laser diode, and the photo detector from the outside environment. The metal cap has an opening formed in its ceiling. A glass is attached below the opening to enable light to be transmitted through the glass from the laser diode to an exterior device and from an exterior device to the photo detector.

20 Claims, 5 Drawing Sheets

OPTICAL STRUCTURE HAVING AN OPTICAL DIODE AND A SENSOR IN SEPARATE APERTURES INSIDE DOUBLE INSULATING LAYERS

BACKGROUND OF THE INVENTION

1. Field of the Invention

The present invention relates generally to the packaging of semiconductor devices. More particularly, the present invention relates to a reduced thickness semiconductor optical communication device package and a method of fabricating the same.

2. Description of the Related Art

In general, optical communication is a method by which information is transmitted and received by means of light.

When information is required to be transmitted, the information is first converted to an electrical signal, which is then converted again to a communication signal and then sent to a laser diode, that is, a light-emitting diode. The laser diode converts the electric communication signal to an optical signal, which is then transmitted through an optical fiber. An apparatus for converting the electric signal to the optical signal and transmitting the optical signal to the optical fiber is called a transmitter. After being outputted from the transmitter and then transmitted through the optical fiber over a long distance, an amplification circuit restores the original attenuated signal wave, which is then converted to an electric signal by a photo detector for detecting the light, that is, a light receiving element. The light receiving element, which plays the opposite role to that of the transmitter, is called a receiver.

In the light transmitter and receiver, the most important component is an optic semiconductor package, a light coupling module, which converts the electric signal to the optical signal and the optical signal to the electric signal. The optic semiconductor package includes optical elements such as a laser diode and a photo detector, optical fibers, and parts for packaging the optical elements and fibers.

Two kinds of methods, active alignment and passive alignment, are generally employed in coupling the optical fiber for transmitting light with the optical elements. Presently, the optic semiconductor package employing active alignment is mostly utilized. In the optic semiconductor package by the active alignment, an optical element is usually adhered to a substrate, and the optical element and the substrate are electrically connected with each other by a conductive wire. Thereafter, a metal can, to which a glass is attached, is coupled to the substrate over the optical element, and the optical fiber is adjustably fixed to the glass attached to the metal can. Thereafter, the position of the optical fiber is precisely adjusted according to a change of the electric signal or the optical signal after the optical element is operated, and the optical fiber is completely fixed to the metal can in an optimal optical coupling state by means of laser welding, soldering, or epoxy adhesion.

In the conventional optic semiconductor package as described above, the optical fiber and the optical element can be stably fixed in relation to each other, and measurements can be easily carried out. However, due to the thickness of the substrate, the optical element, and the conductive wire, the metal can has an increased height, thereby increasing the volume of the package itself. The above-mentioned conductive wire has a fixed loop height relative to the upper surface of the optical element, and the loop height puts a restriction on minimizing the distance between the optical element and the glass. The relatively large distance between the optical element and the glass deteriorates the optical coupling efficiency. Moreover, in the conventional optic semiconductor package, since a wire bonding has to be carried out to an optical element of a very small size (several hundred $\mu$m), a very precise wire bonding apparatus is necessary, and the manufacturing process is complicated and the manufacturing cost is increased.

BRIEF SUMMARY OF THE INVENTION

In accordance with the present invention, an optic semiconductor package includes a plate shaped substrate having an insulation layer through which two spaced apart layer apertures are formed. The substrate further includes a plurality of electrically conductive patterns formed on the wall surfaces of the layer apertures and a lower surface of the insulation layer. One of a laser diode and a photo detector are disposed in a different one of the two layer apertures and are each electrically connected to the electrically conductive patterns through conductive bumps formed on the laser diode and the photo detector. An insulation plate, having a plurality of plate apertures formed through portions of the insulation plate adjacent to the electrically conductive patterns, is coupled to the lower surface of the substrate. One of a plurality of conductive pins electrically connected with the electrically conductive patterns is fitted in each of the plate apertures of the insulation plate and extends downward from the insulation plate. An integral metal cap is attached to upper and side portions of the substrate to protect the substrate, the laser diode, and the photo detector from the outside environment. The metal cap has an opening formed in its ceiling. A glass is attached below the opening to enabling light from the laser diode to be transmitted through the glass to an exterior device and from an exterior device to the photo detector.

In one embodiment of the present invention, the layer apertures are formed from layer aperture first portions at an upper portion of the layer apertures and from layer aperture second portions at a lower portion of the layer apertures. The layer aperture first portions and layer aperture second portions are in optical communication and the layer aperture first portions have diameters smaller than the diameters of the layer aperture second portions. With the configuration of this embodiment, boundary surfaces disposed between the layer aperture first portions and the layer aperture second portions are formed. Advantageously, part of the electrically conductive patterns may be formed on the boundary surfaces allowing closer optical coupling between the optical fiber and the laser diode and the optical fiber and the photo detector. The overall thickness of the semiconductor package is also reduced.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION OF THE INVENTION

Figure 1A:
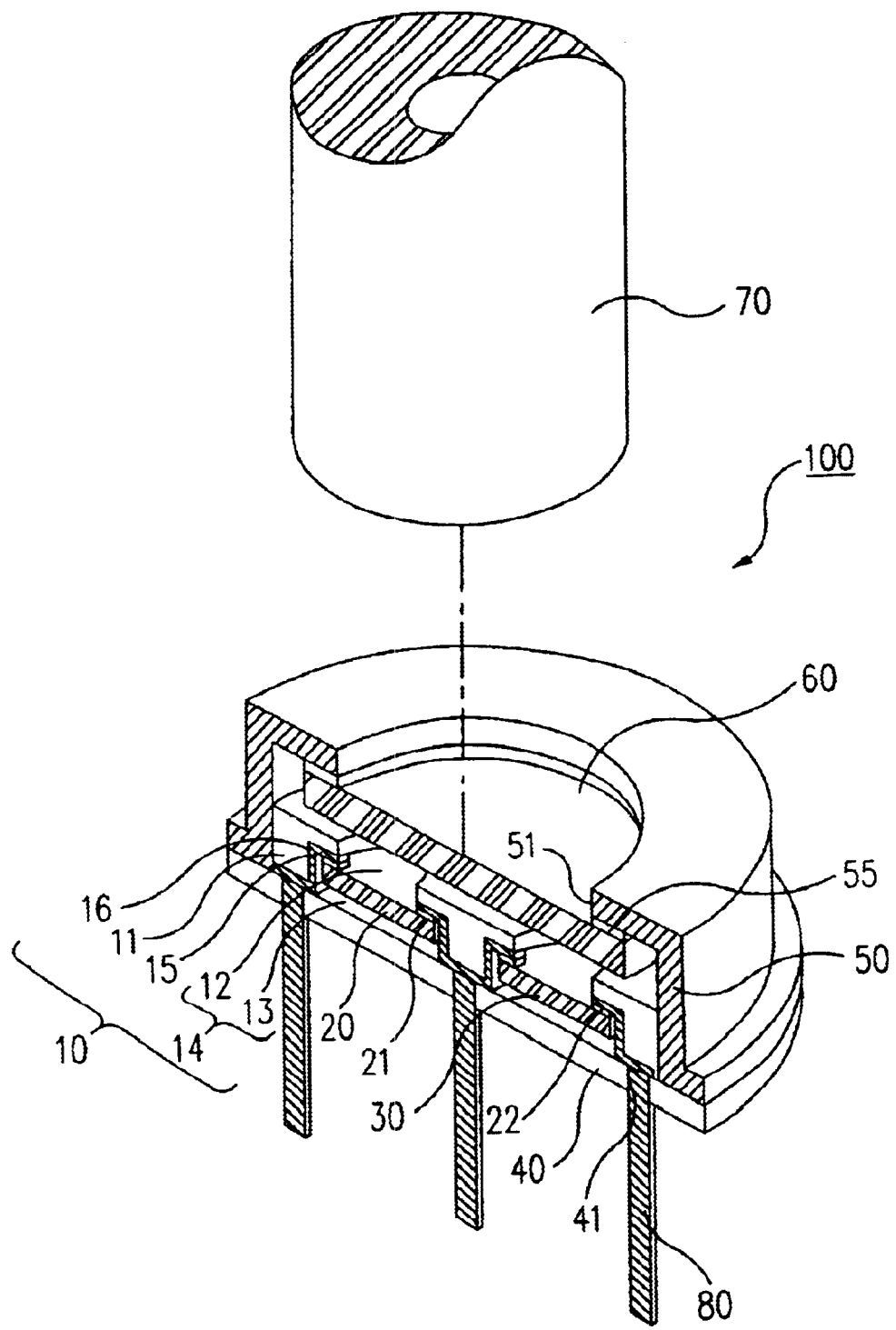
FIG. 1A is a partly cut-out perspective view of one embodiment of an optic semiconductor package according to the present invention.
Figure 1B:
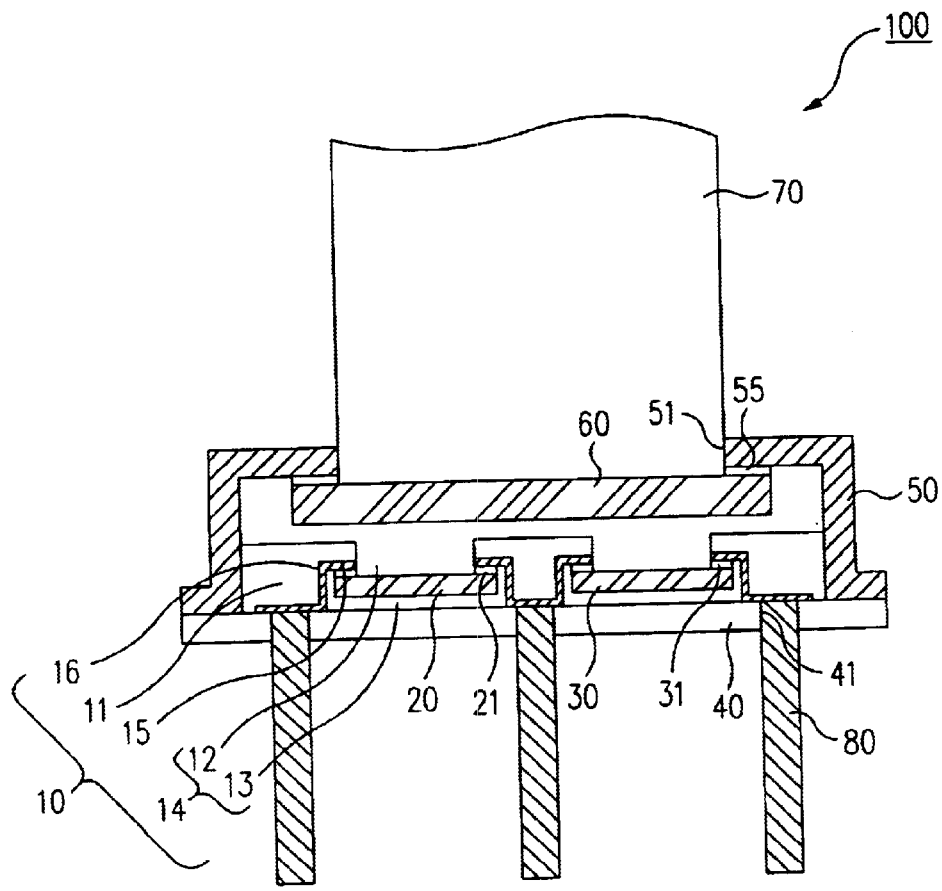
FIG. 1B is a sectional view of an optic semiconductor package of FIG. 1A.
Figure 1C:
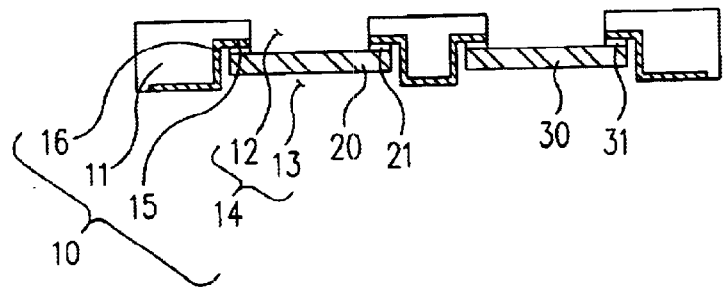
FIG. 1C is an enlarged sectional view showing a coupled state between an optical element and a substrate employed in the optic semiconductor package of FIG 1B.

Referring to FIGS. 1A, 1B, and 1C together, one embodiment of an optic semiconductor package of the present invention is illustrated.

In an optic semiconductor package 100, a substrate 10 includes an insulation layer 11 substantially shaped like a plate, through which two layer apertures 14 are formed, and a plurality of electrically conductive patterns 16 formed on a portion of the substrate 10 along wall surfaces of the layer apertures 14 to a lower surface of the insulation layer 11. The insulation layer 11 may be formed of ceramic, thermosetting resin, film, tape, or their equivalents.

In more detailed description about the layer apertures 14 of the substrate 10, each of the layer apertures 14 includes a layer aperture first portion 12 formed at an upper portion of the layer aperture, and a layer aperture second portion 13 optically communicating with the layer aperture first portion 12 formed at a lower portion of the layer aperture 14. The layer aperture first portion 12 has a diameter smaller than that of the layer aperture second portion 13. Therefore, a boundary surface 15, which has a uniform width and is in parallel with an upper surface and a lower surface of the insulation layer 11, is disposed between the layer aperture first portion 12 and the layer aperture second portion 13. Further, a part of each of the electrically conductive patterns 16 is formed on the boundary surface 15, the wall surface of the layer aperture second portion 13, and the lower surface of the insulation layer 11 at the lower outer edge of the layer aperture second portion 13. In one embodiment, the layer aperture first portion 12 has a depth as small as possible. The smaller the depth of the layer aperture first portion 12 is, the nearer the optical fiber and the optical element, which will be described later, become, so that the optical coupling efficiency is increased.

A laser diode 20 for converting an electric signal to an optical signal and outputting the optical signal, and a photo detector 30 for converting an optical signal to an electric signal and outputting the electric signal are, respectively, disposed in the second apertures 13. Conductive bumps 21 and 31, having a uniform thickness, are respectively formed on upper surfaces of the laser diode 20 and the photo detector 30, and the conductive bumps 21 and 31 are connected to electrically conductive patterns 16 of the boundary surface 15. The material of the conductive bumps 21 and 31 may be any conductive material such as gold (Au), silver (Ag), solder (Sn/Pb) or its equivalent.

An insulation plate 40 substantially shaped like a plate, which has a plurality of plate apertures 41 is coupled to the lower surface of the substrate 10. The plate apertures 41, which are located adjacent to the electrically conductive patterns 16 formed on the lower surface of the substrate 10, are formed through portions of the insulation plate 40 and a plurality of conductive pins 80 are fitted through each of the plate apertures 41.

Active areas of the laser diode 20 and the photo detector 30 are formed on upper surfaces thereof and exposed through the layer aperture first portion 12 to the upper exterior. The laser diode 20 is electrically connected with the conductive pins 80 through the conductive bumps 21 and the conductive patterns 16. The photo detector 30 is also electrically connected with the conductive pins 80 through the conductive bumps 21 and the electrically conductive patterns 16.

The substrate 10 has an area smaller than the area of the insulation plate 40, so that the insulation plate 40 protrudes beyond the edge of the substrate 10. An integral metal cap 50 is assembled with the lateral sides of the substrate 10. The metal cap 50 has an opening having a predetermined diameter and formed at an upper portion of the metal cap 50. That is, the side wall of the metal cap 50 extends vertically while the lower inner side surfaces of the metal cap 50 are in contact with sides of the substrate 10. An opening 51 having a predetermined diameter is formed thorough a ceiling of the metal cap 50. Lower surfaces of the metal cap 50 are in contact with and supported by the insulation plate 40.

A glass 60 is attached to a portion of a lower surface of the ceiling of the metal cap 50 around the opening 51 by means of an attach material 55. The glass 60 may be a common plate glass or a lens. An optical fiber 70, through which the optical signal is transmitted and received, is fitted through the opening 51 of the metal cap 50 and coupled to the metal cap 50 by laser welding, soldering, or epoxy adhesion.

In the optic semiconductor package 100 having the construction as described above, an electric signal from an external device (not shown) is transmitted to the laser diode 20 through the conductive pins 80, the electrically conductive patterns 16, and the conductive bumps 21, and then the electric signal is converted to an optical signal by the laser diode 20. Thereafter, the optical signal is transmitted through the glass 60 to the optical fiber 70. An optical signal from the optical fiber 70 is transmitted through the glass 60 to the photo detector 30 and then is converted to an electric signal by the photo detector 30. Then, the electric signal is transmitted to the external device (not shown) through the conductive bumps 31, the electrically conductive patterns 16, and the conductive pins 80.

Since the laser diode 20 and the photo detector 30 are positioned in the second apertures 13 of the substrate 10 and electrically connected to the electrically conductive patterns 16 through the conductive bumps 21 and 31, the thickness of the optic semiconductor package 100 is very small. Although the conventional package is relatively thick not only because the laser diode and the photo detector are located on the surface of the substrate but also due to the loop height of the conductive wire, only the thickness of the substrate 10 constitutes most of the thickness of the entire optic semiconductor package 100 according to the present invention. Therefore, the entire optic semiconductor package 100 is very thin.

The glass 60 is not in contact with the laser diode 20 or the photo detector 30. The glass 60 or the optical fiber 70 can be disposed as closely to the substrate 10 as possible, so as to increase the optical coupling efficiency between the optical fiber 70 and the laser diode 20 or the photo detector 30. The most important thing in the optic semiconductor package 100 is to obtain a maximum efficiency in coupling optical elements with the optical fiber 70 for transmitting light. That is, the more linearly a wave guide (not shown) of the optical element and a core (not shown) of the optical fiber are aligned with each other, the greater the efficiency is. Further, the nearer the optical element and the optical fiber are located, the easier it is to align the wave-guide and the core in a straight line.

Figure 1D:
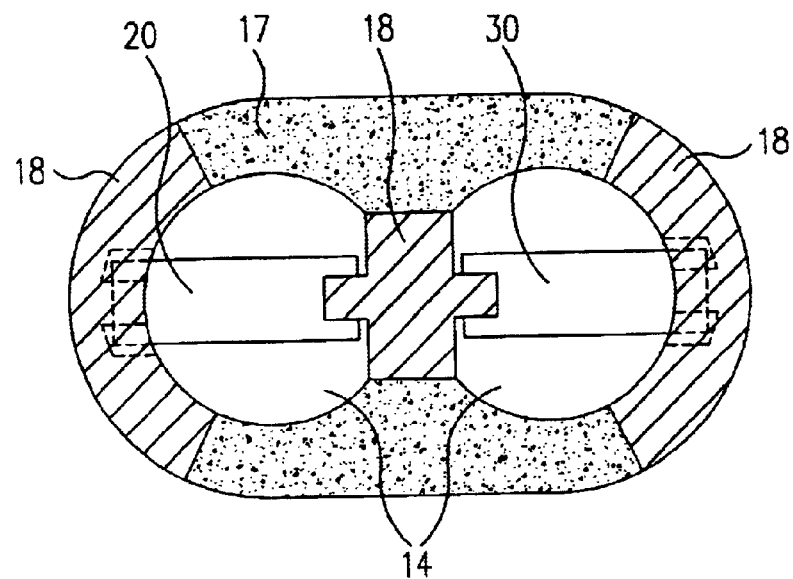
FIG. 1D is a plan view showing the optical elements of FIG. 1C coupled to another substrate employed in another embodiment of an optic semiconductor package according to the present invention.

Referring to FIG. 1D, illustrated is a plan view showing the optical elements of FIG. 1C coupled to another substrate employed in another embodiment of an optic semiconductor package according to the present invention.

Two layer apertures 14 are spaced a predetermined distance apart from each other. Around the layer apertures 14 are disposed insulators 17 and conductors 18 which are sintered so as to constitute one substrate together. The laser diode 20 and the photo detector 30 are disposed, one by one, in the layer apertures 14, and the conductors 18 serve as a substrate sector electrically connected to the laser diode 20 and the photo detector 30 while the insulators 17 serve as an insulation sector of the substrate.

Conductive bumps (not shown) are formed on upper surfaces of the laser diode 20 and the photo detector 30 and are connected to the conductors 18. Active areas of the laser diode 20 and the photo detector 30 are formed on upper surfaces thereof and are exposed through the layer apertures 14 to the upper exterior.

In the substrate having the construction as described above, since it is not necessary to form a separate electrically conductive pattern, the construction and the manufacturing method of the substrate can be simplified. Also, the substrate of FIG. 1D has all advantages of the substrate employed in the optic semiconductor package shown in FIGS. 1A, 1B, and 1C.

Referring to FIGS. 2A to 2F, the process flow for constructing the embodiment illustrated by FIGS. 1A to 1C is discussed.

Figure 2A:
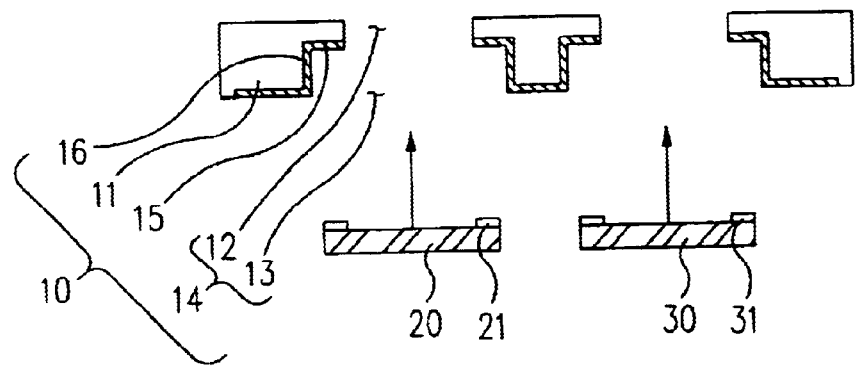
FIGS. 2A to 2F is a series of views used for discussing a method of manufacturing an optic semiconductor package according to the present invention.

Referring to FIG. 2A, the substrate 10, which includes the insulation layer 11 substantially shaped like a plate, through which two layer apertures 14 are formed, and the conductive patterns 16 formed on a portion of the substrate 10 from wall surfaces of the layer apertures 14 to a lower surface of the insulation layer 11, is provided.

Each of the layer apertures 14 includes the layer aperture first portion 12 formed at an upper portion of layer aperture 14, and the layer aperture second portion 13 optically communicating with the layer aperture first portion 12 and formed at the lower portion of the layer aperture 14. The layer aperture first portion 12 has a diameter smaller than that of the layer aperture second portion 13, and the boundary surface 15 is disposed between the layer aperture first portion 12 and the layer aperture second portion 13. The plurality of electrically conductive patterns 16 are formed on the boundary surface 15, the wall surface of the layer aperture second portion 13, and the lower surface of the insulation layer 11 at the lower outer edge of the layer aperture second portion 13. In one embodiment, the layer aperture first portion 12 has a depth as small as possible. The smaller the depth of the layer aperture first portion 12 is, the nearer the optical fiber and the optical element become, so that the optical coupling efficiency is increased.

The laser diode 20 and the photo detector 30 are respectively disposed in the second apertures 13, and the conductive bumps 21 and 31 are respectively formed on the upper surfaces of the laser diode 20 and the photo detector 30. The upper surfaces of the laser diode 20 and the photo detector 30 serve as active areas. The laser diode 20 converts an electric signal to an optical signal and outputs the optical signal, while the photo detector 30 converts an optical signal to an electric signal and outputs the electric signal.

Figure 2B:
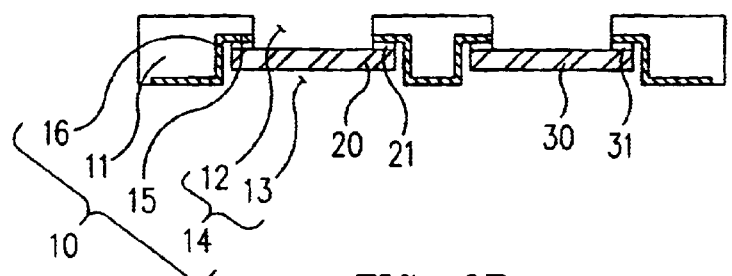

Referring to FIG. 2B, the laser diode 20 and the photo detector 30 are disposed in the layer apertures 14 of the substrate 10 and electrically connected to the electrically conductive patterns 16. That is, the conductive bumps 21 and 31 formed on the upper surfaces of the laser diode 30 and the photo detector 30 are electrically connected to the part of the electrically conductive pattern 16 formed in the boundary surface 15, so that the electric connection between them is achieved. In one embodiment, the layer aperture second portion 13 has a depth larger than or equal to the thickness of the laser diode 20 and the photo detector 30, so that the thickness of an entire assembly including the laser diode 20, the photo detector 30, and the substrate 10 is not larger than the thickness of the substrate 10.

Figure 2C:
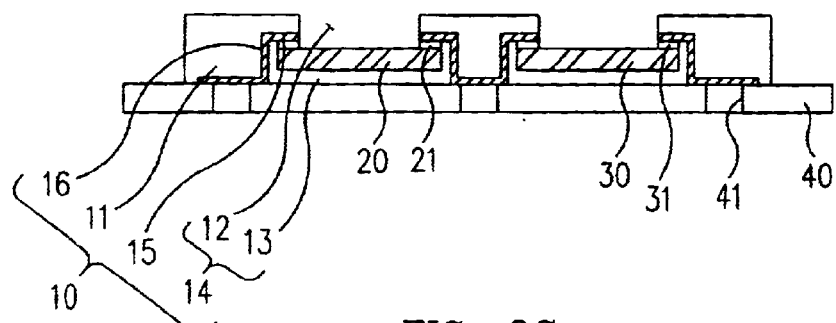

Referring to FIG. 2C, the insulation plate 40 is coupled to the lower surface of the substrate 10. Plate apertures 41, which are located adjacent to the electrically conductive patterns 16 formed on the lower surface of the substrate 10, are formed through portions of the insulation plate 40. In one embodiment, the insulation plate 40 extends beyond the edge of the substrate 10.

Figure 2D:
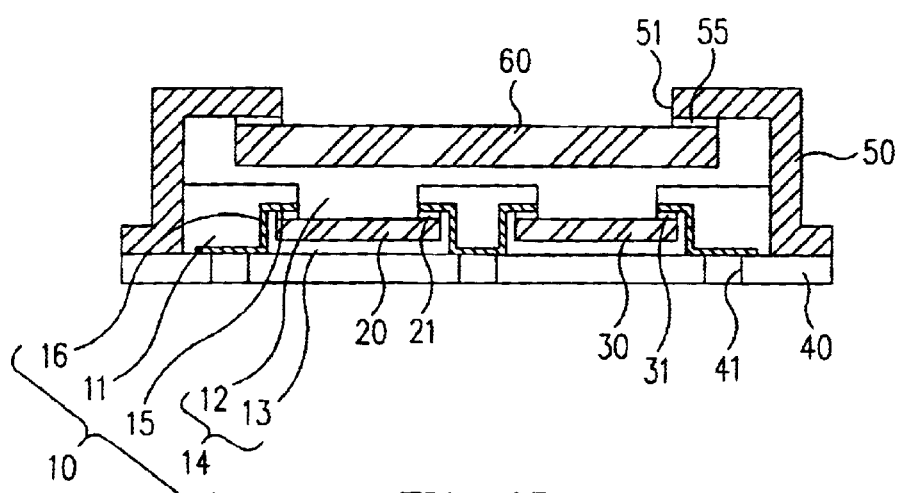

Referring to FIG. 2D, the metal cap 50 is attached to the upper surface of the insulation plate 40 and the side surfaces of the substrate 10. The opening 51 is formed through the ceiling of the metal cap 50, and a glass 60 or a lens is attached to the opening 51 by means of the attach material 55. In one embodiment, the opening 51 or the glass 60 of the metal cap 50 is disposed as closely to the upper surface of the substrate 10 as possible. That is, since the laser diode 20 and the photo detector 30 are not disposed above the upper surface of the substrate 10, the glass 60 or the opening 51 of the metal cap 50 can be disposed as closely to the substrate 10 as possible, so as to maximize the optical coupling efficiency. The metal cap 50 protects the substrate 10, the laser diode 20, and the photo detector 30 from the surroundings and transmits light from the laser diode 20 to the exterior and from the exterior to the photo detector 30. In one embodiment, the space defined by the metal cap 50, the glass 60, and the substrate 10 is maintained in a vacuum state, so as to minimize the refractive index within the space and to seal the laser diode 20 and the photo detector 30 from the outside environment.

Figure 2E:
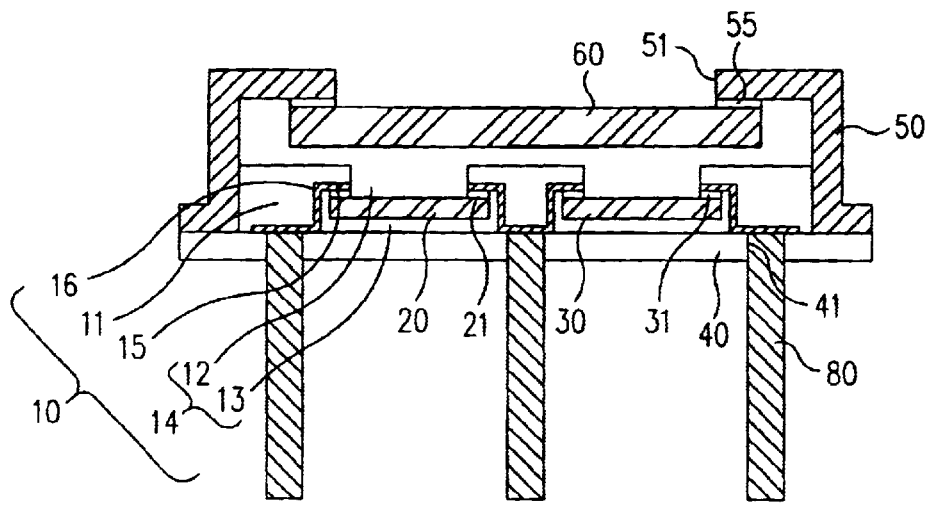

Referring to FIG. 2E, conductive pins 80 are fitted one by one in the plate apertures 41 formed through the insulation plate 40. Since the plate apertures 41 are located adjacent to the electrically conductive patterns 16 as described above, the conductive pins 80 are electrically connected with the electrically conductive patterns 16. Therefore, the laser diode 20 and the photo detector 30 can transmit and receive to and from external devices (not shown) through the conductive bumps 21 and 31, the electrically conductive patterns 16, and the conductive pins 80.

Figure 2F:
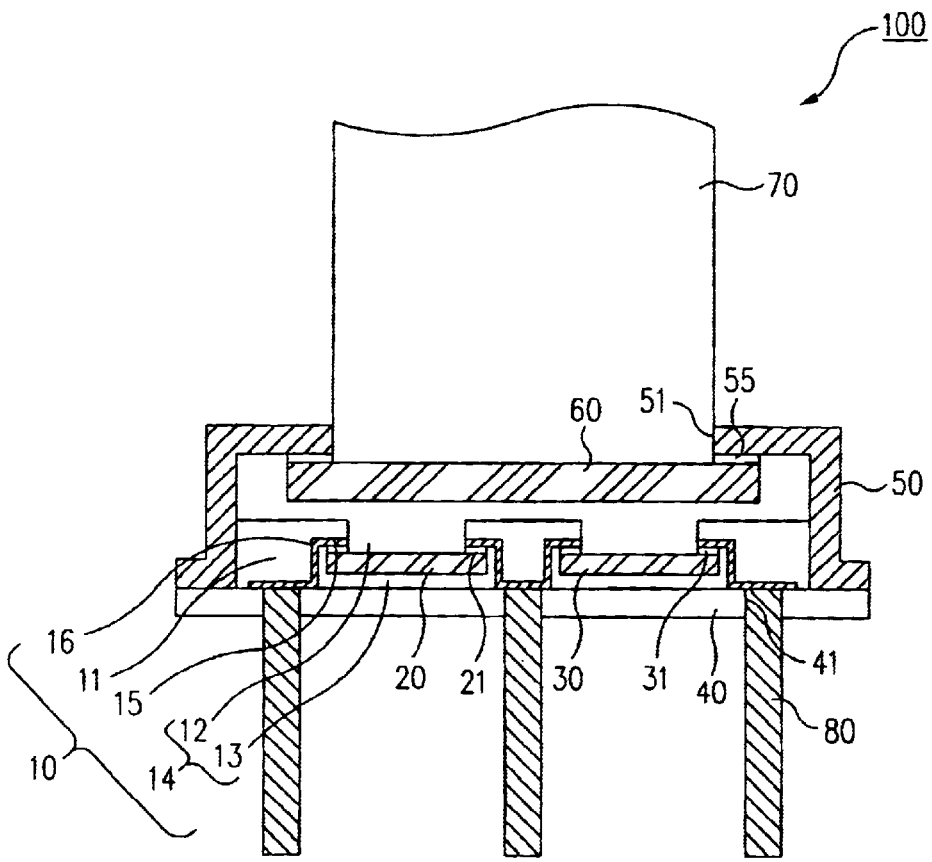

Referring to FIG. 2F, the optical fiber 70 is coupled to the opening 51 of the metal cap 50 by means of laser welding, soldering, or epoxy adhesion. That is, the optical fiber 70 is completely fixed to the opening 51 of the metal cap 50 by means of laser welding, soldering, or epoxy adhesion after being adjusted according to change of the electrical signal or the optical signal through the operation of the laser diode 20 and the photo detector 30.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. An optic semiconductor package comprising:

a substrate including an insulation layer substantially shaped like a plate;

two layer apertures formed through the insulation layer and spaced a predetermined distance apart;

a plurality of electrically conductive patterns formed on wall surfaces of the layer apertures and on a lower surface of the insulation layer;

a laser diode having conductive bumps and a photo detector having conductive bumps, wherein one of the laser diode and the photo detector is disposed in a different one of the two layer apertures and is electrically connected to the plurality of electrically conductive patterns through, respectively, the laser diode conductive bumps and the photo detector conductive bumps;

an insulation plate, substantially shaped like a plate, coupled to a lower surface of the substrate;

a plurality of plate apertures formed through insulation plate portions located adjacent to the plurality of electrically conductive patterns;

a plurality of conductive pins, one of the conductive pins being fitted in each of the plate apertures and extending downward from the insulation plate, the plurality of conductive pins being electrically connected to the plurality of electrically conductive patterns;

an integral metal cap attached to upper and side portions of the substrate to protect the substrate, the laser diode and the photo detector, the metal cap having an opening of predetermined diameter formed through a ceiling of the metal cap; and a glass attached to the metal cap below the opening.

2. An optic semiconductor package as claimed in claim 1 further comprising an optical fiber coupled to the opening of the metal cap.

3. An optic semiconductor package as claimed in claim 1, wherein the insulation layer is formed from a material selected from the group consisting of ceramic, thermohardening resin, film, and tape.

4. An optic semiconductor package as claimed in claim 1, wherein each of the two layer apertures comprises:

a layer aperture first portion formed at an upper portion of the layer aperture;

a layer aperture second portion formed at a lower portion of the layer aperture, in optical communication with the layer aperture first portion, and having a diameter greater than a diameter of the layer aperture first portion; and a boundary surface disposed between the layer aperture first portion and the layer aperture second portion.

5. An optic semiconductor package as claimed in claim 4, wherein the plurality of electrically conductive patterns is formed on the boundary surface of each layer aperture, on a wall surface of the layer aperture second portions, and on a lower surface of the insulation layer, the plurality of electrically conductive patterns being electrically connected with the plurality of conductive pins.

6. An optic semiconductor package as claimed in claim 4, wherein the laser diode conductive bumps and the photo detector conductive bumps are electrically connected at the boundary surfaces with the plurality of electrically conductive patterns.

7. An optic semiconductor package comprising:

a substrate including an insulation layer;

two layer apertures formed through the insulation layer and spaced a predetermined distance apart;

a plurality of electrically conductive patterns formed on the insulation layer;

a laser diode having conductive bumps;

a photo detector having conductive bumps; and wherein one of the laser diode and the photo detector is disposed in a different one of the two layer apertures and is electrically connected to the plurality of electrically conductive patterns through, respectively, the laser diode conductive bumps and the photo detector conductive bumps.

8. An optic semiconductor package as claimed in claim 7, wherein the insulation layer is shaped like a plate.

9. An optic semiconductor package as claimed in claim 7, wherein the plurality of conductive patterns is formed on wall surfaces of the layer apertures and on a lower surface of the insulation layer.

10. An optic semiconductor package as claimed in claim 7, further comprising:

an insulation plate coupled to a lower surface of the substrate;

a plurality of plate apertures formed through insulation plate portions located adjacent to the plurality of electrically conductive patterns.

11. An optic semiconductor package as claimed in claim 10 further comprising:

a plurality of conductive pins, one of the conductive pins being fitted in each of the plate apertures and extending downward from the insulation plate, the plurality of conductive pins being electrically connected to the plurality of electrically conductive patterns.

12. An optic semiconductor package as claimed in claim 7 further comprising:

an integral metal cap attached to upper and side portions of the substrate to protect the substrate, the laser diode and the photo detector, the metal cap having an opening of predetermined diameter formed through a ceiling of the metal cap.

13. An optic semiconductor package as claimed in claim 10 further comprising:

a glass attached to the metal cap below the opening.

14. An optic semiconductor package as claimed in claim 12 further comprising:

an optical fiber coupled to the opening of the metal cap.

15. An optic semiconductor package as claimed in claim 13, wherein a space defined by the metal cap, the glass, and the substrate is in a vacuum state.

16. An optical semiconductor package comprising:

a substrate including a means for insulating;

two layer apertures formed through the means for insulating and spaced a predetermined distance apart;

a plurality of electrically conductive patterns formed on the means for insulating;

a means for emitting light having conductive bumps;

a means for receiving light having conductive bumps; and wherein one of the means for emitting light and the means for receiving light is disposed in a different one of the two layer apertures and is electrically connected to the plurality of electrically conductive patterns through, respectively, the means for emitting light conductive bumps and the means for receiving light conductive bumps.

17. An optic semiconductor package as claimed in claim 16, wherein each of the two layer apertures comprises:
- a layer aperture first portion formed at an upper portion of the layer aperture;
- a layer aperture second portion formed at a lower portion of the layer aperture, in optical communication with the layer aperture first portion, and having a diameter greater than a diameter of the layer aperture first portion; and
- a boundary surface disposed between the layer aperture first portion and the layer aperture second portion.

18. An optic semiconductor package as claimed in claim 17, wherein the plurality of electrically conductive patterns is formed on the boundary surface of each layer aperture, on a wall surface of the layer aperture second portions, and on a lower surface of the means for insulating, the plurality of electrically conductive patterns being electrically connected with a plurality of conductive pins.

19. An optic semiconductor package as claimed in claim 17, wherein the means for emitting light conductive bumps and the means for receiving light conductive bumps are electrically connected at the boundary surfaces with the plurality of electrically conductive patterns.

20. An optic semiconductor package as claimed in claim 16 further comprising:
- an integral metal cap attached to upper and side portions of the substrate to protect the substrate, the means for emitting light and the means for receiving light, the metal cap having an opening of predetermined diameter formed through a ceiling of the metal cap; and
- a glass attached to the metal cap below the opening, wherein a space defined by the metal cap, the glass, and the substrate is in a vacuum state.

* * * * *